United States Patent
Nakamura et al.

[11] 3,953,800
[45] Apr. 27, 1976

[54] TUNING INDICATOR FOR A RADIO FREQUENCY RECEIVER

[75] Inventors: Tadao Nakamura, Flushing, N.Y.; Barry C. Detwiler, New Milford, N.J.; John A. Marchetti, Staten Island, N.Y.

[73] Assignee: Matsushita Electric Industrial Co., Ltd., Kadoma, Japan

[22] Filed: Oct. 26, 1973

[21] Appl. No.: 409,940

[52] U.S. Cl. ............. 325/455; 340/324 R; 340/378 R; 334/86; 116/124.4; 116/124 A
[51] Int. Cl.² .............. H04B 1/06; H03J 1/04
[58] Field of Search ........... 350/96 B; 340/379, 380, 340/324 B; 325/455; 178/DIG. 2; 240/2.1; 334/86; 116/124.1 A, 124.4, DIG. 26, DIG. 29

[56] References Cited
UNITED STATES PATENTS

| | | | |
|---|---|---|---|
| 3,222,666 | 12/1965 | Hallden | 340/324 |
| 3,555,539 | 1/1971 | Richards | 340/324 |
| 3,639,747 | 2/1972 | Schmidt | 350/96 B |
| 3,701,951 | 10/1972 | Krausser | 325/455 |
| 3,753,119 | 8/1973 | Close | 325/455 |
| 3,820,096 | 6/1974 | Himmelsbach | 350/96 B |
| 3,836,911 | 9/1974 | Gibson et al | 340/380 |

Primary Examiner—Robert L. Griffin
Assistant Examiner—Aristotelis M. Psitos

[57] ABSTRACT

A radio or television receiver is selectively tunable to one of a number of carrier frequencies transmitted from distant broadcast stations and has a tuning indicator for displaying the frequency of a selected station. The indicator includes a station frequency encoder, having a plurality of sets of indicia representative of a plurality of frequencies of the broadcast stations, arranged to move, as the receiver is tuned, between a light source and the proximal end of a fiber optic bundle. The distal end of the fiber optic bundle is arranged on a display panel to illuminate segments of seven-bar numerical configuration in the form of a squared figure eight. When the receiver is tuned to a station, the indicia, corresponding to the frequency of the station, are aligned with the proximal ends of the fiber optic bundle. Light from the light source is transmitted through the indicia, and the fibers of the fiber optic bundle aligned with the indicia, to the display panel where the bars of the numerical configuration are selectively illuminated to form digits representing the frequency of the station. To insure an accurate display of the station frequency, an alignment indicator actuates the light source only when the indicia are aligned with the fiber optic bundle.

4 Claims, 6 Drawing Figures

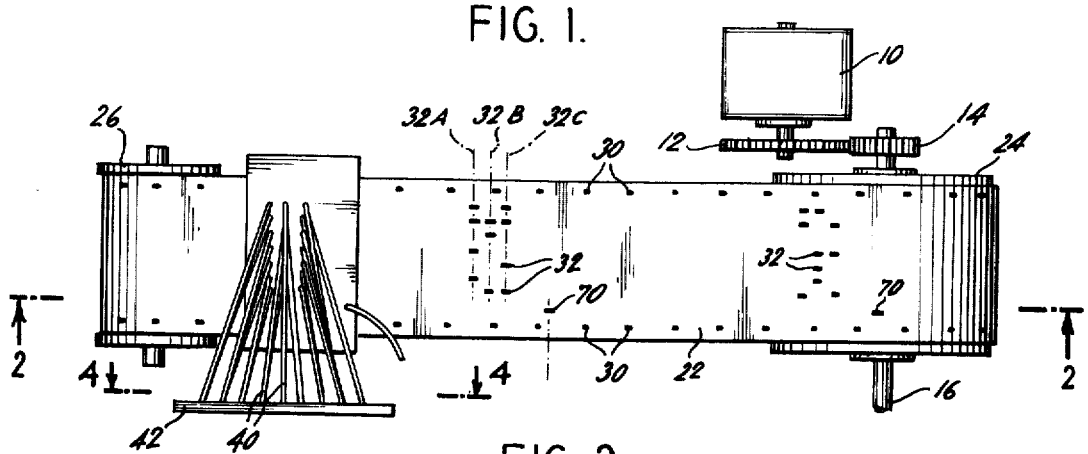
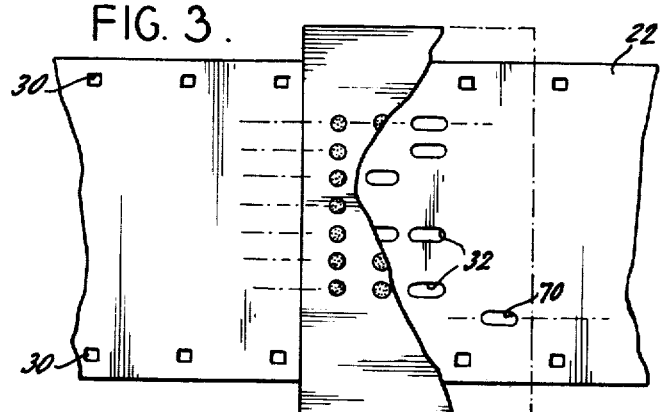
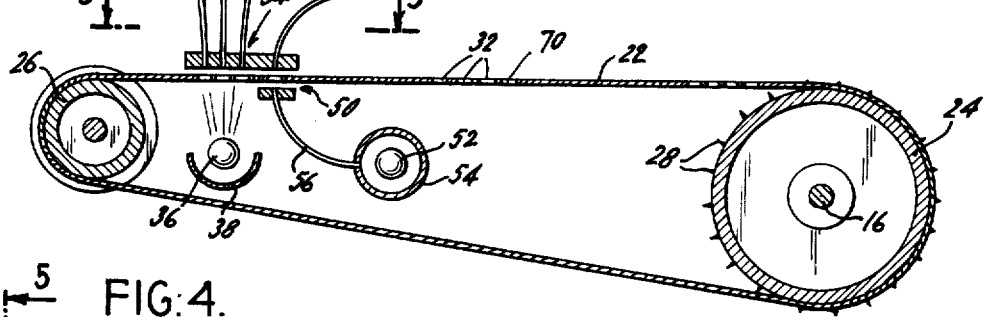
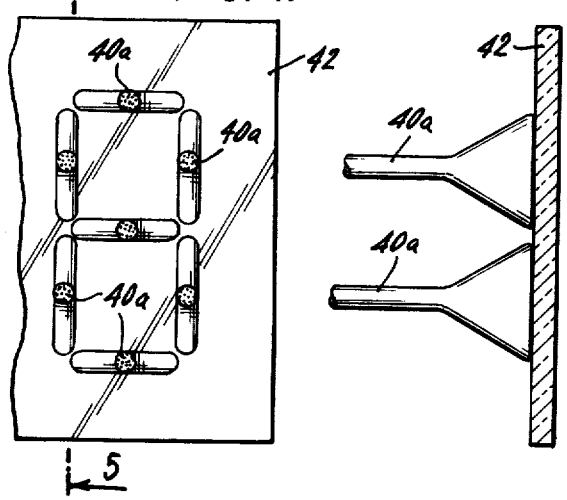
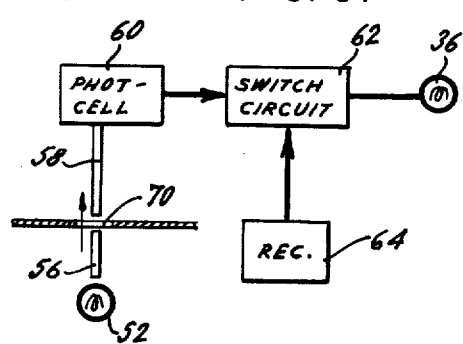

TUNING INDICATOR FOR A RADIO FREQUENCY RECEIVER

BACKGROUND OF THE INVENTION

The invention relates to radio and television receivers and in particular to indicators for displaying the radio frequency of a station to which the receivers are tuned.

Numerous popular entertainment devices, such as television and AM and FM radios, utilize radio frequency receivers to detect and reproduce in audible form radio frequency signals transmitted by distant broadcast stations. These receivers are generally tuned to select one of a number of stations by setting the resonant frequency of an oscillator in the receiver to a frequency which differs from the frequency of the signal transmitted from the station by a predetermined fixed amount. In conventional receivers, the resonant frequency of the oscillator can be continually varied for detection of all stations in a band of frequencies, for example, by varying the capacitance of a capacitor in the oscillator circuit. Coupled to the capacitor is a tuning indicator, which moves as the capacitance is changed, to identify the frequency of the station to which the receiver is tuned.

Many types of tuning indicators have been used in the past. In one type of indicator, the frequencies are imprinted on a disc rotatably coupled to the capacitor. As the capacitance is changed, the disc moves relative to a window positioned in the receiver through which the frequencies of the stations can be observed. In a second type of indicator, the frequencies are imprinted on a fixed scale and a pointer is arranged to move relative to the fixed scale as the receiver is tuned. These indicators, however, are often difficult to read and do not always provide an accurate indication of the frequency of the station being received.

Recently, digital displays have been introduced for a variety of applications. An example is an "Optical Display Digital Watch" disclosed in U.S. Pat. No. 3,566,602 to Bergey et al, of Mar. 2, 1971 wherein the time is displayed in digital form in a display window. Fiber optic bundles are interposed between the display window and minute and hour wheels, having indicia representative of the time which are driven by the watch movement, and provide light transmission paths for displaying the time indicia, from the minute and hour wheels, in the display window. While this type of display is relatively easy to read, the watch disclosed in the above-referenced patent provides a continuous display and has no provisions for accurately aligning the time information with the fiber optic bundle.

In accordance with the present invention, a tuning indicator for a radio frequency receiver produces a digital display of the frequencies of received broadcast stations which is accurate and relatively easy to read and is displayed only when the receiver is tuned to a station.

SUMMARY OF THE INVENTION

In accordance with the invention, a tuning indicator for a radio frequency receiver, tunable to one of a plurality of stations in a frequency band, has a display panel, a first light source, a fiber optic bundle having its distal end terminating in the display board and its proximal end positioned to receive light from the first light source, and a station frequency encoder, having at least one set of indicia representative of the frequency of one of the plurality of stations, mounted for movement between the first light source and the proximal end of the fiber optic bundle to orient the set of indicia in a reading position between the first light source and the proximal end of the fiber bundle. The tuning means for indicating the alignment of the set of indicia between the first light source and the proximal end of the optical fiber bundle in the reading position including a second light source and means responsive to light from the second light source for producing a control signal indicative of the alignment of the set of indicia for controlling the first light source in accordance with the alignment of the set of indicia at the reading position.

In the preferred embodiment of the invention, the station frequency encoder includes an alignment index positioned proximate each set of indicia for cooperation with aligning means. Further, the means responsive to light from the second light source includes a light sensitive device, a first optical fiber having its distal end coupled to the second light source and its proximal end positioned for alignment with the alignment index and a second optic fiber having its proximal end positioned for alignment with the alighment index and its distal end coupled to the light sensitive device.

In operation, as the receiver is tuned, the station frequency encoder carrying the sets of indicia moves between the fiber optic bundle and the first light source. When a set of indicia corresponding to the frequency of a station is aligned between the fiber optic bundle and the first light source at the reading position, light from the second light source is transmitted via the first and second optical fibers and the alignment index to the light sensitive device producing a control signal which actuates the first light source. Light from the first light source is then transmitted to the proximal end of the fiber optic bundle and through the individual optic fibers aligned with the indicia to illuminate the display panel and form a digital display of the frequency of the station. When the set of indicia is not aligned with the fiber optic bundle at the reading position, no light is received by the light sensitive device. Thus the control signal is not present and the first light source is deactuated to prevent light from the first light source from reaching the proximal end of the fiber optic bundle. In this manner, the display is formed on the display panel only when a set of indicia are aligned between the first light source and the proximal end of the fiber optic bundle.

BRIEF DESCRIPTION OF THE DRAWINGS

FIG. 1 is a top plan and schematic representation of a tuning indicator according to the present invention;

FIG. 2 is a sectional view taken along the line 2—2 of FIG. 1 and looking in the direction of the arrow;

FIG. 3 is an enlarged plan view taken along the line 3—3 of FIG. 2 looking in the direction of the arrow and partially in section showing a typical set of indicia aligned with the fiber optic bundle;

FIG. 4 is an enlarged view taken along the line 4—4 of FIG. 1 and looking in the direction of the arrow and partially broken away showing the optical fibers arranged in a seven-bar squared eight configuration;

FIG. 5 is a sectional view taken along the line 5—5 of FIG. 4 and looking in the direction of the arrow showing typical terminations of optic fibers on the display panel; and FIG. 6 is a diagramatic and schematic representation of a circuit for insuring alignment between the station frequency encoder and fiber optic bundle.

DESCRIPTION OF THE PREFERRED EMBODIMENT

With reference to the figures, there is shown a portion of a radio frequency receiver for receiving an information modulated radio frequency carrier signal transmitted from a television or radio broadcast station. The receiver has a conventional input circuit, generally designated by reference numeral 10, which is tunable to select one of the transmitted radio frequency signals. The input circuit conventionally contains a variable frequency oscillator whose resonant frequency is changed by varying the capacitance of a variable capacitor in the tank circuit of the oscillator. As shown schematically, the capacitor is coupled through gears 12 and 14 to shaft 16 which is connected to a tuning knob. In tuning the radio frequency receiver to select a broadcast station, shaft 16 is rotated thereby changing the capacitance and resonant frequency of the oscillator. A broadcast station having a carrier frequency which is a fixed frequency difference from the resonant frequency of the oscillator causes a signal to be produced which is coupled to a demodulator which separates the information from the radio frequency carrier signal. The information signal is then amplified and an output signal produced.

In accordance with the invention, the receiver has a tuning indicator for accurately displaying, in an easy to read format, the carrier frequency of a selected station. The tuning indicator includes a station frequency encoder 22, in the form of an elongated closed loop paper tape or photographic film, supported for movement around drums 24 and 26 which are mounted on the receiver. Drum 24, fixed to shaft 16 has sprockets 28 projecting from the surface thereof arranged to engage perforations 30 extending at space intervals along the opposite edges of station frequency encoder 22.

Rather than provide a graduated numerical scale, the frequencies of the stations are encoded on the station frequency encoder as sets of indicia, 32, which can, for example, be elongated perforations in a paper tape or undeveloped spots on a developed photographic film. As shown, by way of example, each set of perforations on a paper tape consists of three columns, 32A, 32B, 32C, for encoding each of three numbers, with seven positions in each column. As will be described, by placing perforations at appropriate positions in each column, digits can be formed for identifying a received broadcast station.

Arranged on one side of the tape at reading position, 34, is light source 36 having a reflector 38 positioned to concentrate and direct the light toward the reading position. Mounted on the opposite side of tape 22, and positioned at reading position 34, is a fiber optic bundle, generally designated by reference numeral 40, having its proximal end terminating at the reading position. The individual optic fibers, 40a, comprising the fiber optic bundle are arranged in three rows of seven fibers for alignment with the sets of indicia on the tape. The distal ends of the optical fibers are mounted on display panel 42 and arranged to illuminate individual segments of a seven-bar numeral in the form of a squared figure eight. In one form of the invention, the distal ends of the optic fibers are widened in order that each fiber forms of the numerals.

As the receiver is tuned by rotation of shaft 16, the sprockets in drum 28 engage perforations 30 to move the station frequency encoder carrying the sets of indicia past reading station 34. When a set of indicia is aligned at reading station 34, light from light source 36 is transmitted through the indicia and the optic fibers aligned with the indicia to illuminate bars of the seven-bar numeral. For example, if there are three indicia in one column of the tape, light transmitted through the three optic fibers aligned with the indicia illuminates three bars of the numeral. By proper selection of the positions of the indicia, various combinations of bars can be illuminated to form the digits between 0 and 9 and the set of indicia, as shown, can encode a three digit number to represent the frequency of a received broadcast station. Of course, a greater or lesser number of digits can be used.

To insure that the number displayed on display panel 42 accurately represents the frequency of a received station, the tuning indicator further includes an alignment indicator, designated by reference numeral 50, which prevents light from light source 36 from being transmitted to the reading station until a set of indicia is properly aligned with the fiber optic bundle. The alignment indicator includes a light source 52 surrounded by light shield 54 and positioned on one side of tape 22. Coupled between shield 54 and the reading position is optic fiber 56. Positioned on the other side of the tape, at reading position 34 is optic fiber 58, having one end aligned to receive light from optic fiber 56 and its opposite end coupled to a light sensitive device, such as photocell 60 (FIG. 6). The output of photocell 60 is coupled to switch circuit 62, which is preferably an AND gate whose other input signal is derived from an appropriate circuit in the receiver to indicate that the receiver is receiving a broadcast signal, as represented by reference numeral 64. The output of the switch circuit actuates light source 36 to allow the light source to transmit light to reading station 34 by, for example, turning the light "on", or opening a shutter between the light source and the reading position. Positioned on the tape for alignment between optic fibers 56 and 58, is an alignment index 70, associated with each set of indicia, which cooperates with the alignment indicator to insure that the indicia corresponding to the frequency of a received station are aligned at the reading position before a number is displayed on the display panel.

The operation of the alignment indicator will now be described. When a set of indicia becomes aligned with fiber optic bundle during the tuning of the receiver, alignment index 70 is positioned between optic fibers 56 and 58 permitting light to be transmitted from light source 52 to photocell 60. Light incident to the photocell produces an output signal which is coupled to switch circuit 62. If the receiver is simultaneously tuned to a station, the receiver provides a second input to the switch circuit which actuates light source 36. Light is transmitted to the reading position to selectively illuminate segments of the numbers on the display panel, thereby forming a display of the frequency of the received station, as described above. As a set of indicia moves out of alignment with the fiber optic bundle, the tape becomes interposed between optic fibers 56 and 58 thereby preventing light, transmitted by light source 52, from reaching photocell 60. Since one input signal to switch circuit 62 is not present, the output signal is reduced to zero and light source 40 is deactivated. Thus, as the receiver is tuned, numbers corresponding to the frequency of broadcast stations are consecutively displayed in an easy to read manner to allow an operator to accurately and quickly select a desired broadcast station.

While an illustrative embodiment of the invention has been described in detail, it is to be expressly understood that the invention is not limited thereto. Various changes may also be made in the design and arrangement of the parts without departing from the spirit and scope of the invention as the same is understood by those skilled in the art. For example, the station frequency encoder can be in the form of a disc rather than an elongated tape.

What I claim is:

1. The combination with a receiver tunable to one of a plurality of radio frequency carrier signals transmitted from broadcast stations of a tuning indicator for producing a digital display indicative of the frequency of the carrier signal transmitted from a selected broadcast station, said tuning indicator including a display panel, a first light source, a fiber optic bundle including a plurality of optic fibers, said plurality of optic fibers having their proximal ends positioned at a reading position to receive light from said first light source and their distal ends terminating on said display panel in segments of a numerical display, a station frequency encoder having a plurality of sets of station indicia, each set of station indicia representative of the carrier frequency of one of said broadcast stations, said station frequency encoder further including a plurality of alignment indicia, at least one of said plurality of alignment indicia cooperatively positioned and associated with each set station indicia, means mounting said station frequency encoder for movement relative to the reading position, and means for indicating the alignment of a set of station indicia at the reading position including a second light source, a first optic fiber coupled between said second light source and the reading position and arranged for alignment with the alignment index associated with said one set of indicia, a light sensitive device, a second optic fiber having its proximal end positioned at the reading position for alignment with said alignment index and its distal end coupled to said light sensitive device, said light sensitive device being responsive to light transmitted from said second light source through said first optic fiber, said alignment index, and said second optic fiber to said light sensitive device when said one set of station indicia is aligned at the reading position for producing a first control signal and means responsive to said first control signal for actuating said first light source, light being transmitted from said first light source, through said station indicia and said optic fibers aligned with said indicia to illuminate segments of said numerical display to produce a display indicative of the frequency of the carrier signal received by said radio frequency receiver.

2. A tuning indicator for a radio or television receiver tunable to one of a plurality of radio frequency signals transmitted from broadcast stations comprising a display panel, a first light source, a fiber optic bundle having its distal end terminating in said display panel and its proximal end positioned to receive light from said first light source, a station frequency encoder having a plurality of sets of station indicia, each of said sets of indicia representing one of said plurality of stations, a plurality of alignment indicia, at least one of said alignment indicia cooperatively positioned with each set of station indicia, means mounting said station frequency encoder for movement between said first light source and the proximal end of said fiber optic bundle to orient one of said sets of station indicia at a reading station between said first light source and the proximal end of said fiber optic bundle, means for controlling said first light source in accordance with the alignment of a set of station indicia at said reading station including a second light source arranged and positioned to transmit light through said alignment indicia, a light sensitive device, an optic fiber having its distal end coupled to transmit light to said light sensitive device and its proximal end oriented to receive light transmitted through said alignment indicia, means coupling the output of said light sensitive device in controlling relation to said first light source, light from said second light source being transmitted through one alignment index to said light sensitive device when a set of station indicia associated with said one alignment index is oriented at said reading station to produce a control signal which is coupled to actuate said first light source, light from said first light source being transmitted through the set of station indicia and illuminating said display panel to indicate the selected broadcast station when the receiver is tuned to a broadcast station.

3. The receiver of claim 1 further including means for producing a second control signal indicating that said receiver is receiving a broadcast station, said first light source being actuated in response to both said first and second control signals.

4. The tuning indicator of claim 2 further including means for producing a second control signal indicative of the reception of a radio frequency signal, said means for coupling the output of said light sensitive device to said first light source including means responsive to said second control signal and the output of said light sensitive device for actuating said first light source only when a set of indicia is aligned at the reading station and the receiver is receiving a radio frequency signal.

* * * * *